US012681085B2

(12) United States Patent
Kandula et al.

(10) Patent No.: US 12,681,085 B2
(45) Date of Patent: Jul. 14, 2026

(54) INFIELD PERIODIC DEVICE TESTING WHILE MAINTAINING HOST CONNECTIVITY

(71) Applicant: Intel Corporation, Santa Clara, CA (US)

(72) Inventors: Rakesh Kandula, Doddakannelli Bangalore (IN); Sankaran Menon, Austin, TX (US); Rolf Kuehnis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/954,434

(22) Filed: Sep. 28, 2022

(65) Prior Publication Data

US 2024/0103079 A1     Mar. 28, 2024

(51) Int. Cl.
*G01R 31/3185*     (2006.01)
*G06F 11/22*     (2006.01)

(52) U.S. Cl.
CPC .. *G01R 31/318544* (2013.01); *G06F 11/2236* (2013.01)

(58) Field of Classification Search
CPC .................... G01R 31/318544; G06F 11/2236
See application file for complete search history.

(56) References Cited

U.S. PATENT DOCUMENTS

| | | | |
|---|---|---|---|
| 2012/0226942 A1* | 9/2012 | Gangasani | .............. G06F 11/27 |
| | | | 714/E11.169 |
| 2021/0048476 A1 | 2/2021 | Menon et al. | |
| 2021/0286693 A1* | 9/2021 | Alben | ................. G06F 11/2733 |
| 2022/0082617 A1 | 3/2022 | Kuehnis et al. | |

(Continued)

OTHER PUBLICATIONS

A. Cilardo, N. Mazzocca and L. Coppolino, "Virtual Scan Chains for Online Testing of FPGA-based Embedded Systems," 2008 11th EUROMICRO Conference on Digital System Design Architectures, Methods and Tools, Parma, Italy, 2008, pp. 360-366 (Year: 2008).*

*Primary Examiner* — Cynthia Britt
(74) *Attorney, Agent, or Firm* — Nicholson De Vos Webster & Elliott LLP

(57)     ABSTRACT

Embodiments described herein may include apparatus, systems, techniques, and/or processes that are directed to performing testing of a device while a system is operational. A device may include computing circuitry and host connectivity registers. Host connectivity registers contain configuration and memory mapping data programmed by system software upon power up of the device and computing system. The data contained in host connectivity registers should be always maintained while the computing system is operational. Scan test circuitry may be implemented, providing the ability to test the device while the system is operational. Preservation circuitry preserves or maintains the data stored in host connectivity registers allowing in-operation testing of the device, ensuring the device the ability to return to full operation at the end of in-operation testing without requiring system software to reprogram the host connectivity registers. By using scan-sealing methods and/or preserving the data in host connectivity registers during in-operation testing, performance and user experience are not degraded.

20 Claims, 12 Drawing Sheets

700

(56)               References Cited

U.S. PATENT DOCUMENTS

| | | | |
|---|---|---|---|
| 2023/0084463 A1* | 3/2023 | Chakravarty | G06F 3/0617 |
| | | | 714/718 |
| 2023/0342037 A1* | 10/2023 | Sahin | G06F 3/0659 |
| 2023/0342059 A1* | 10/2023 | Mayraz Matosevich | |
| | | | G06F 3/0659 |
| 2024/0004770 A1* | 1/2024 | Poornachandran | |
| | | | G06F 11/0706 |
| 2024/0296897 A1* | 9/2024 | Uribe | G11C 29/022 |

* cited by examiner

| |
|---|
| Base Address 0 |
| Base Address 1 |
| Base Address N |
| |
| Power State |
| Interrupt |
| |
| MMIO 0 |
| MMIO 1 |
| MMIO N |
| |
| Completion/Status |
| |

400

402
404
406
408
410
412
414
416
418

700

702

Device

Scan Chains for Logic Other than Host Connectivity

704

Host Connectivity Module

706

Config Space

708

MMIO Space

Scan Chains for Host Connectivity Logic

900

902 — Infield test mode is activated

904 — Power up storage device

906 — Perform save operation

908 — Perform infield scan testing

910 — Perform restore operation

912 — Power down storage device

914 — Resume normal device operation

1200

1210
System startup

1220
Enter power-up test mode

1230
Perform scan testing of device including host connectivity registers

1240
Program host connectivity registers

1250
Perform normal device operations

1260
Enter in-operation test mode

1270
Preserve data stored in host connectivity registers

1280
Perform scan testing

1290
Resume normal device operations

INFIELD PERIODIC DEVICE TESTING WHILE MAINTAINING HOST CONNECTIVITY

TECHNICAL FIELD

Embodiments of the present disclosure generally relate to the field of computing, in particular, to infield testing of computing systems.

BACKGROUND

Design complexity and size of semiconductor devices in computing systems are increasing at a fast pace. Several markets, such as server, client, and automotive (driver assist) use complex semiconductor systems with highly integrated technologies where digital logic, analog logic, and memories are designed into one package, such as a system on a chip (SoC), a multi-chip package (MCP), system in/on a package, and a stacked-die based system. Increased safety, reliability, and cost-control are important for these computing devices.

Reliability and trust-ability are significant factors that cannot be guaranteed without extensive testing. Occasionally defects appear during operation of the device, often due to environmental conditions or aging-related issues. While devices are extensively tested in the manufacturing process, ongoing testing is needed to ensure the computing systems operate safely, dependably and at optimal performance. Many devices in the field are tested during power on/off cycles since testing often overwrites operational data such as host connectivity data. In some computing systems, the power on/off cycles may occur rarely or at random intervals.

A solution is needed that provides an ability to perform testing of devices during operation, maintaining host connectivity while minimizing performance loss and degradation of user experience.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
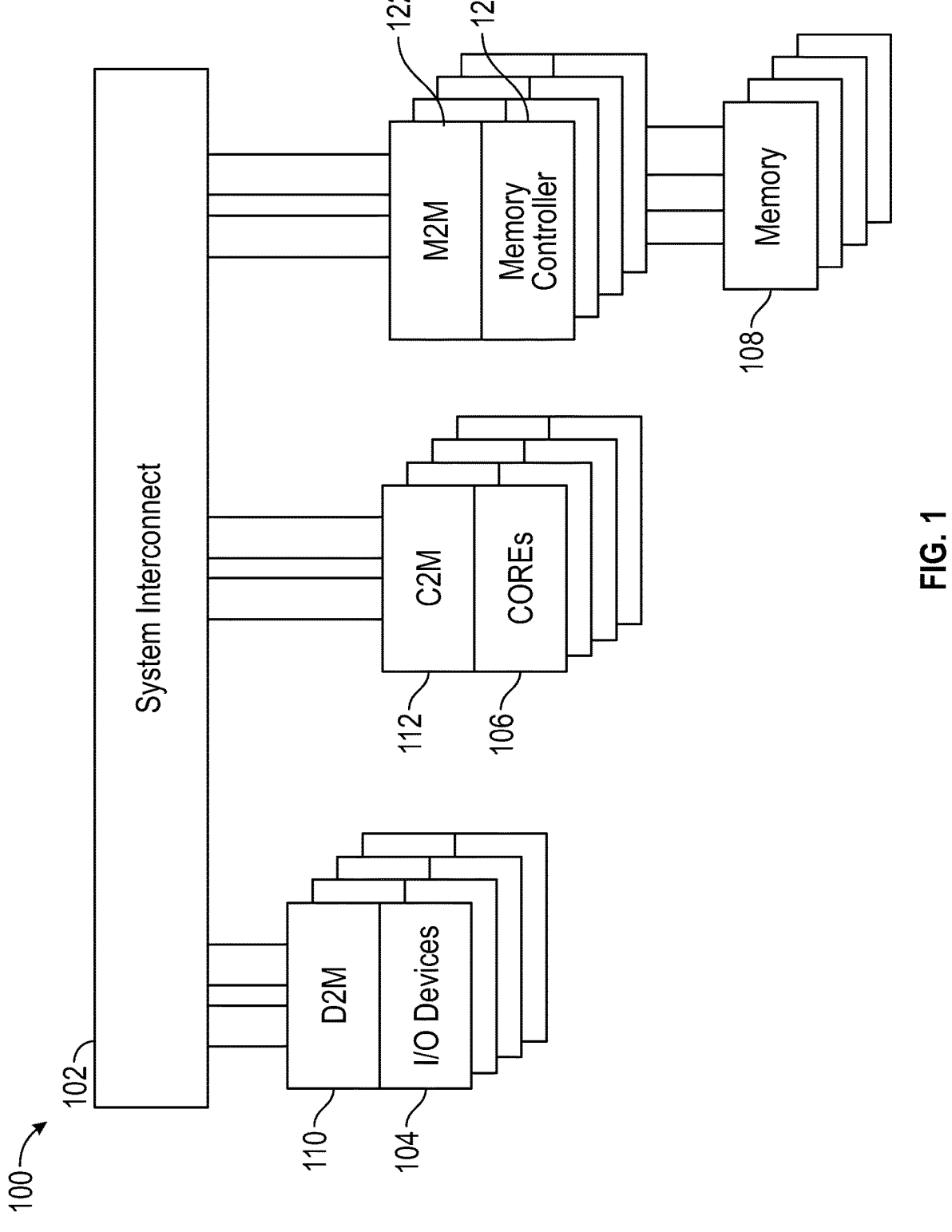
FIG. 1 illustrates a computing system in accordance with various embodiments.

Embodiments described herein may include apparatus, systems, techniques, and/or processes that are directed to performing testing of a device while a system is operational. A device may include functional logic for normal system operation and host connectivity registers. Functional logic may include compute engines, input/output (I/O) logic, memory access logic, system registers and the like. Host connectivity registers contain configuration and memory mapping data programmed by system software upon power up of the device and computing system. The data contained in host connectivity registers should be always maintained while the computing system is operational. Scan test circuitry may be implemented, providing the ability to test the device while the system is operational. Preservation circuitry preserves or maintains the data stored in host connectivity registers allowing in-operation testing of the device, ensuring the device the ability to return to full operation at the end of in-operation testing without requiring system software to reprogram the host connectivity registers. By using scan-sealing methods and/or preserving the data in host connectivity registers during in-operation testing, performance and user experience are not degraded.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

FIG. 1 illustrates a computing system in accordance with various embodiments. System 100 may be any type of computing platform, ranging from small portable devices such as smartphones, tablet computers and so forth to larger devices such as client systems, for example, desktop or workstation systems, server systems and so forth. System 100 includes a system interconnect 102 through which one or more input/output (110) devices 104 and one or more cores 106 communicate to a memory 108. System interconnect 102 may be a Network on a Chip (NoC) fabric or other system communication channel. Coupled to I/O devices 104 are device-to-mesh (D2M) units 110. D2M units 110 operate to process requests from I/O devices 104 for memory transactions and send corresponding transactions to memory 108. D2M units 110 may further process the memory transaction from I/O device 104, for example, by mapping a virtual address to a physical address, and the like to generate the corresponding memory transaction sent to memory 108 through system interconnect 102. Coupled to cores 106 are core-to-mesh (C2M) units 112. C2M units 112 operate to process requests from cores 106 for memory transactions and send corresponding transactions to memory 108. C2M units 112 may further process the memory transaction from core 106, for example, by mapping a virtual address to a physical address, and the like to generate the corresponding memory transaction sent to memory 108 through system interconnect 102.

D2M 110 and C2M 112 may contain configuration and memory mapping registers (not shown). These registers are programmed by operating system (OS) software, device drivers, enumeration software and the like upon start-up of computing system 100. The contents of these registers provide for host connectivity and need to be maintained or preserved while system 100 is in operation. If the contents of these registers are not maintained during operation of computing system 100, host connectivity may be lost, causing system failure and/or interrupt in operation due to the need for reprogramming by OS or device drivers degrading performance and user experience. According to various embodiments, the contents of the memory mapping and configuration registers are maintained or preserved during testing while computing system is operational.

In an embodiment, each I/O device 104 and D2M 110 may be components of a system on a chip (SoC). In an embodiment, multiple I/O devices 104 and one or more D2M 110 may be multiple chips in a single package. In an embodiment, each core 106 and C2M 112 may be components of a SoC. In an embodiment, multiple cores 106 and one or more C2M 112 may be multiple chips in a single package. In an embodiment, the majority of the components of system 100 may be in a single package with multiple chips or multiple systems on a single chip (SoC).

A mesh to memory (M2M) unit 122 receives and processes received memory transactions from system interconnect 102 for memory controller 124. These received memory transactions may originate from any of I/O devices 104 and cores 106 and possibly other devices not shown. Memory controller 124 controls memory accesses to memory 108. Memory 108 may be implemented as a shared virtual memory (SVM). In an embodiment, memory access controller 124 and M2M 122 are components of a SoC. In an embodiment, memory 108, memory controller 124 and the M2M 122 are components of a SoC. In an embodiment, memory controller 124, M2M 122, cores 106 and C2M 112 are components of a system on a chip (SoC)

Examples of I/O devices 104 and cores 106 include, but are not limited to, central processing units (CPUs), graphic processing units (GPUs), various peripheral component interconnect express (PCIe) devices, processes, a phase-locked loop (PLL) unit, an input/output (I/O) unit, an application specific integrated circuit (ASIC) unit, a field-programmable gate array unit, a graphics card, a III-V unit, an accelerator, and a three-dimensional integrated circuit (3D IC). Note that some I/O devices 104 and/or cores 106 may include a processor complex which may include one or more cores or processing engines.

In system 100, cores 106 may be heterogeneous, that is, diverse cores. For example, one of cores 106 may be a large processing engine designated to run foreground and/or high-performance applications. Another of cores 106 may be a small computing engine designated to run low priority background processes. Additionally, another of cores 106 may be on a low power domain of system 100, also processing low priority background processes.

While a configuration of system 100 has been described, alternative embodiments may have different configurations. While system 100 is described as including the components illustrated in FIG. 1, alternative embodiments may include additional components that facilitate the operation of system 100.

Figure 2:
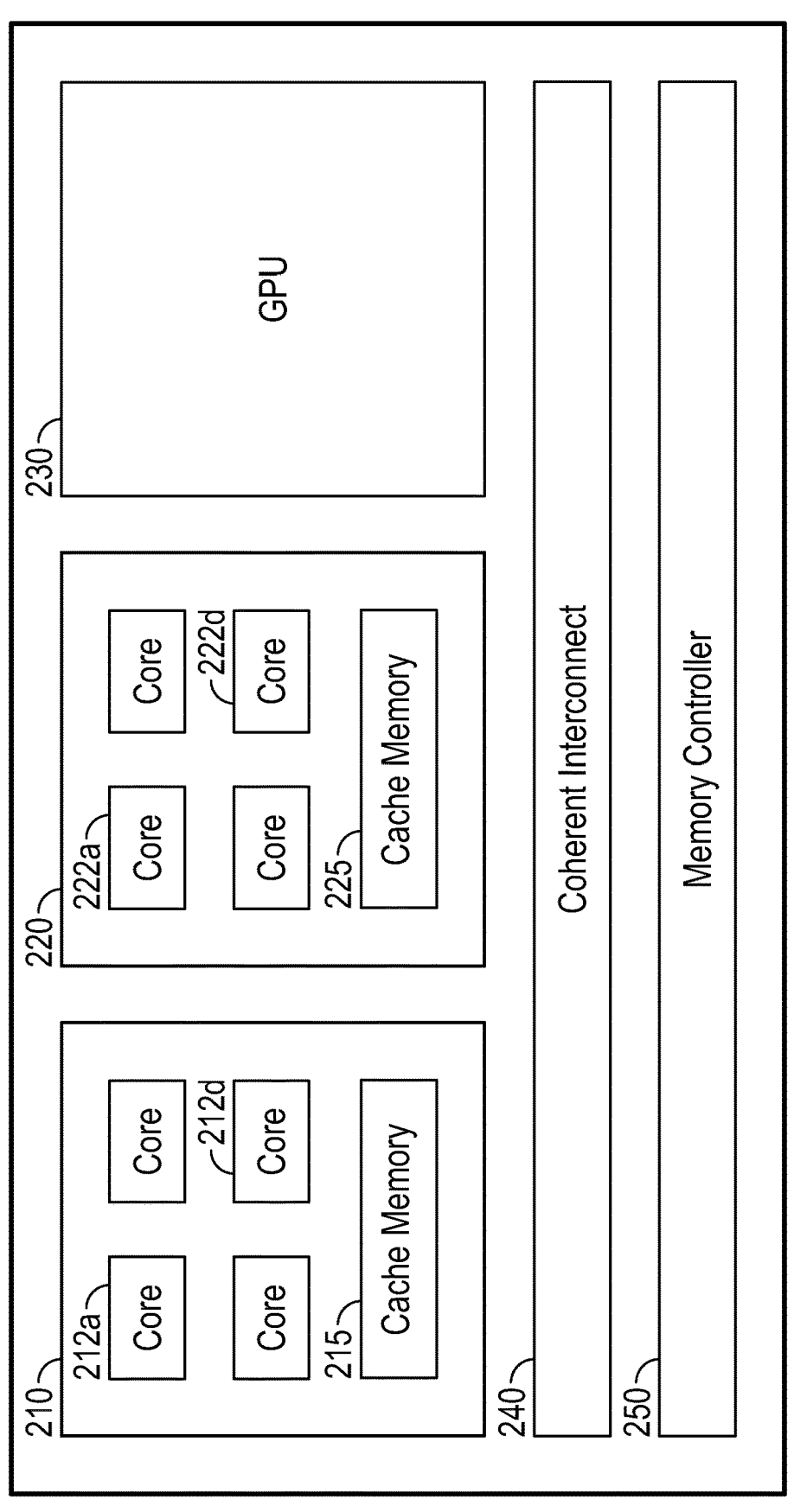
FIG. 2 illustrates a block diagram of a representative computing system in accordance with various embodiments.

Referring now to FIG. 2, shown is a block diagram of a representative computing system in accordance with various embodiments. In the embodiment shown, computing system 200 may be any type of computing platform, ranging from small portable devices such as smartphones, tablet computers and so forth to larger devices such as client systems, for example, desktop or workstation systems, server systems and so forth. As an example, computing system 200 may be implemented using asymmetric or different types of cores, such as combinations of higher power and/or low power cores, e.g., out-of-order cores and in-order cores. In different embodiments, these cores may be based on a mix of architectural design cores.

As seen in FIG. 2, computing system 200 includes a first core domain 210 having a plurality of first cores 212a-212d. In an example, these cores may be low power cores such as in-order cores. In turn, these cores couple to a cache memory 215 of core domain 210. In addition, computing system 200 includes a second core domain 220. In the illustration of FIG. 2, second core domain 220 has a plurality of second cores 222a-222d. In an example, these cores may be higher power-consuming cores than first cores 212. In an embodiment, the second cores may be out-of-order cores. In turn, these cores couple to a cache memory 225 of core domain 220. Note that while the example shown in FIG. 2 includes 4 cores in each domain, understand that more or fewer cores may be present in a given domain in other examples.

With further reference to FIG. 2, a graphics domain 230 also is provided, which may include one or more graphics processing units (GPUs) configured to independently execute graphics and other workloads, e.g., provided by one or more cores of core domains 210 and 220. As an example, GPU domain 230 may be used to provide display support for a variety of screen sizes, in addition to providing graphics and display rendering operations.

As seen, the various domains couple to a coherent interconnect 240, which in an embodiment may be a cache coherent interconnect fabric that in turn couples to an integrated memory controller 250. Coherent interconnect 240 may include a shared cache memory, such as an L3 cache, in some examples. In an embodiment, memory controller 250 may be a direct memory controller to provide for multiple channels of communication with an off-chip memory, such as multiple channels of a DRAM (not shown for ease of illustration).

In an embodiment, coherent interconnect 240 and/or memory controller 250 may include configuration and memory mapping registers. If the contents of these registers are not maintained during operation of computing system 200, host connectivity may be lost, preventing component and I/O device controllers from proper initialization, accessing system memory and instruction queues. Loss of data in these registers will cause system failures and stalls due to the need for reprogramming by OS software, enumeration software, device drivers and the like degrading performance and user experience.

In different examples, the number of the core domains may vary. For example, for a low power SoC suitable for incorporation into a mobile computing device, a limited number of core domains such as shown in FIG. 2 may be present. Still further, in such low power SoCs, core domain 220 including higher power cores may have fewer numbers of such cores. For example, in one implementation two cores 222 may be provided to enable operation at reduced power consumption levels. In addition, the different core domains may also be coupled to an interrupt controller to enable dynamic swapping of workloads between the different domains.

In yet other embodiments, a greater number of core domains, as well as additional optional logic may be present, in that an SoC can be scaled to higher performance (and power) levels for incorporation into other computing devices, such as desktops, servers, high-performance computing systems, base stations forth. As one such example, 4 core domains each having a given number of out-of-order cores may be provided. Still further, in addition to optional GPU support, one or more accelerators to provide optimized hardware support for particular functions (e.g. web serving, network processing, switching or so forth) also may be provided. In addition, an input/output interface may be present to couple such accelerators to off-chip components.

Figure 3:
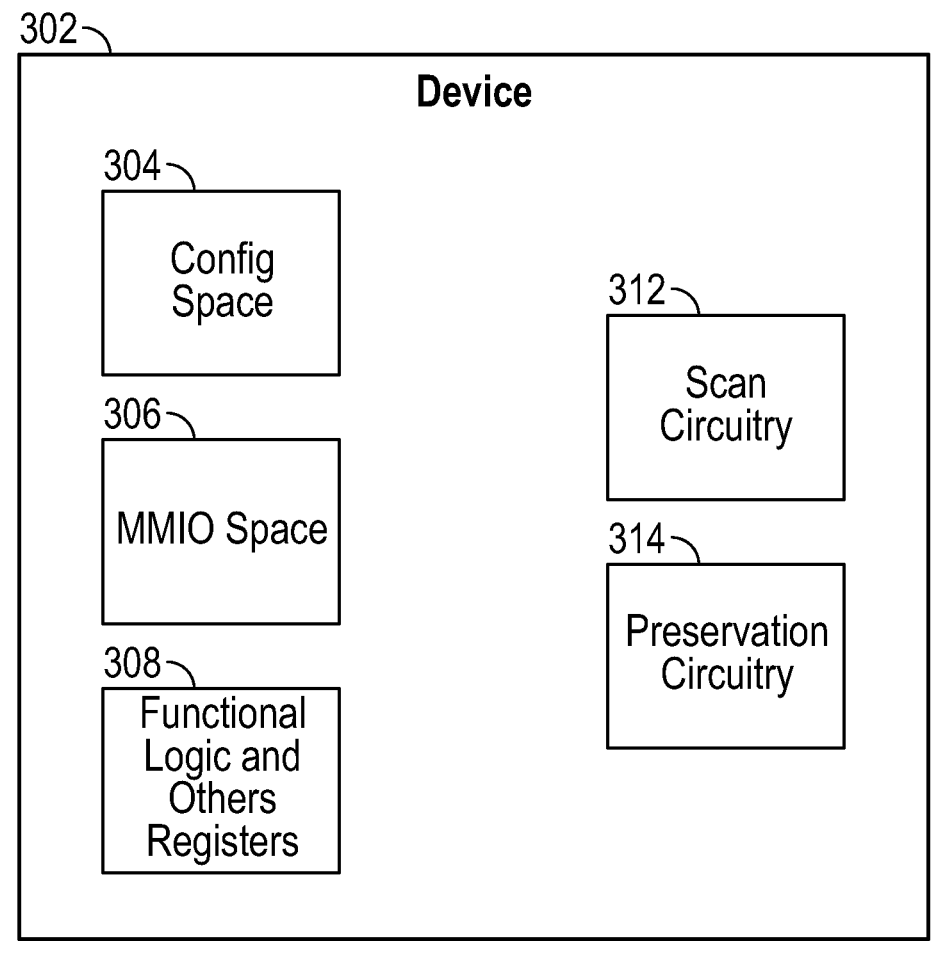
FIG. 3 illustrates a device with infield test circuitry in accordance with various embodiments.

FIG. 3 illustrates a device with infield test circuitry in accordance with various embodiments. Computing system 300 includes a device 302. Device 302 may be all or part of one of I/O devices 104 or cores 106 of FIG. 1, all or part of core domain 210, core domain 220, or graphics domain 230 of FIG. 2, or the like. Device 302 includes host connectivity registers including configuration space registers 304 and memory mapping (MMIO) space registers 306 and functional logic and other registers 308. Functional logic and other registers 308 perform normal system operations and may include compute engines, input/output (I/O) logic, memory access logic, system registers and the like. Device 302 is periodically scan tested during operation to identity failures. If the contents of configuration space registers 304 and MMIO space registers 306 are not maintained during operation of computing system 300, host connectivity may be lost, causing system failure and/or stalls due to the need for reprogramming by OS software, enumeration software, device drivers and the like degrading performance and user experience.

Scan circuitry 312 performs testing to identify any faults in device 302. Scan testing may involve scanning test patterns into internal circuits within the device. In some embodiments, flip-flops of device 302 are modified to allow them to function as stimulus and observation points, or "scan cells" during test, while performing their intended functional role during normal operation. Automatically generated test patterns (also known as ATPG) may be used to successfully test the majority of device 302.

While scan testing is extensively used in manufacturing of devices, scan circuitry 312 may also be used to perform infield testing, that is, after device 302 has been deployed and in operation. Scan testing may be performed when device 302 is powered on and/or off. In addition, scan testing may be performed periodically while device 302 is in operation. Preservation circuitry 314 is used to preserve or maintain the contents of configuration space registers 304 and MMIO registers 306 when performing scan testing while device 302 is in operation.

While infield testing of device 302 has been described as scan testing, any other testing method may be used according to various embodiments. While configuration space registers 306 and MMIO space registers 308 are illustrated as blocks of registers, these registers may be distributed throughout device 302 according to some embodiments. In addition, preservation circuitry 314 may be designed to preserve any data critical to maintaining proper operation of device 302 according to various embodiments.

Figure 4:
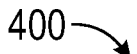
FIG. 4 illustrates an example of host connectivity registers in accordance with various embodiments.
Figure 4:
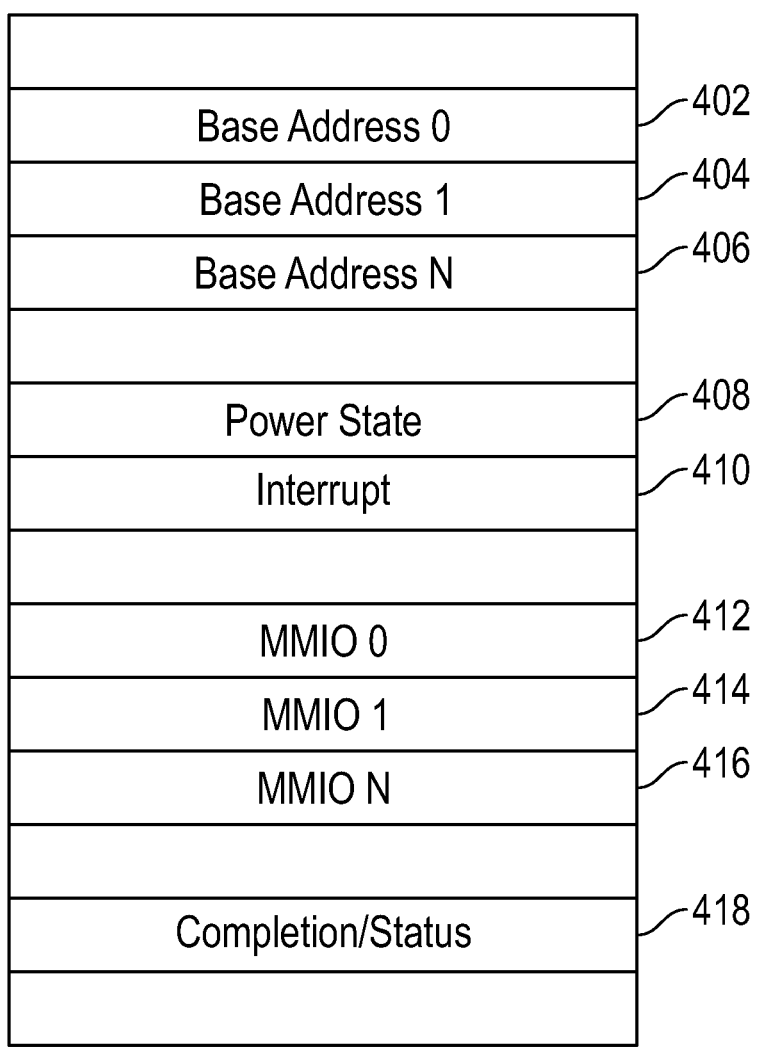

FIG. 4 illustrates an example set host connectivity registers in accordance with various embodiments. Register set 400 includes multiple various registers, for example configuration space registers 306 and MMIO space registers 308 of FIG. 3, that need to be maintained during computing system operation and infield testing to keep host connectivity and avoid performance and user experience degradation. During operation, register set 400 may contain system memory pointers, device memory space requirements, address locations and/or pointers to commands that are posted by software for the device, address locations and/or pointers for device processed data to be posted, and the like. Examples of such registers include the Base Address Region (BAR registers) 402, 404 and 406, power state register 408 detailing the different power states supported by the device, interrupt register 410 detailing the types of interrupts supported. Further examples may include various memory mapped registers (MMIO) 412, 414 and 416 that contain data such as memory pointers from where a device obtains the commands from system memory, and process and keep it in the completion/status area in system memory. Completion/Status register 418 includes a pointer is provided by the device driver to the device/components.

All or portions of register set 400 may be programmed by OS software, enumeration software and/or device drivers during the power ON of the computing system. To avoid performance and user experience degradation, preferably portions of register set 400 should be maintained such that reprogramming by software is not necessary after periodic in-field testing is performed.

Only a small set of configuration and memory mapping registers are shown in register set 400 for the sake of simplicity. However, cores, I/O devices and controllers may have many more such registers implemented in the computing system. Although register set 400 is shown contiguously, the registers may be in different locations and non-contiguous address spaces.

Figure 5:
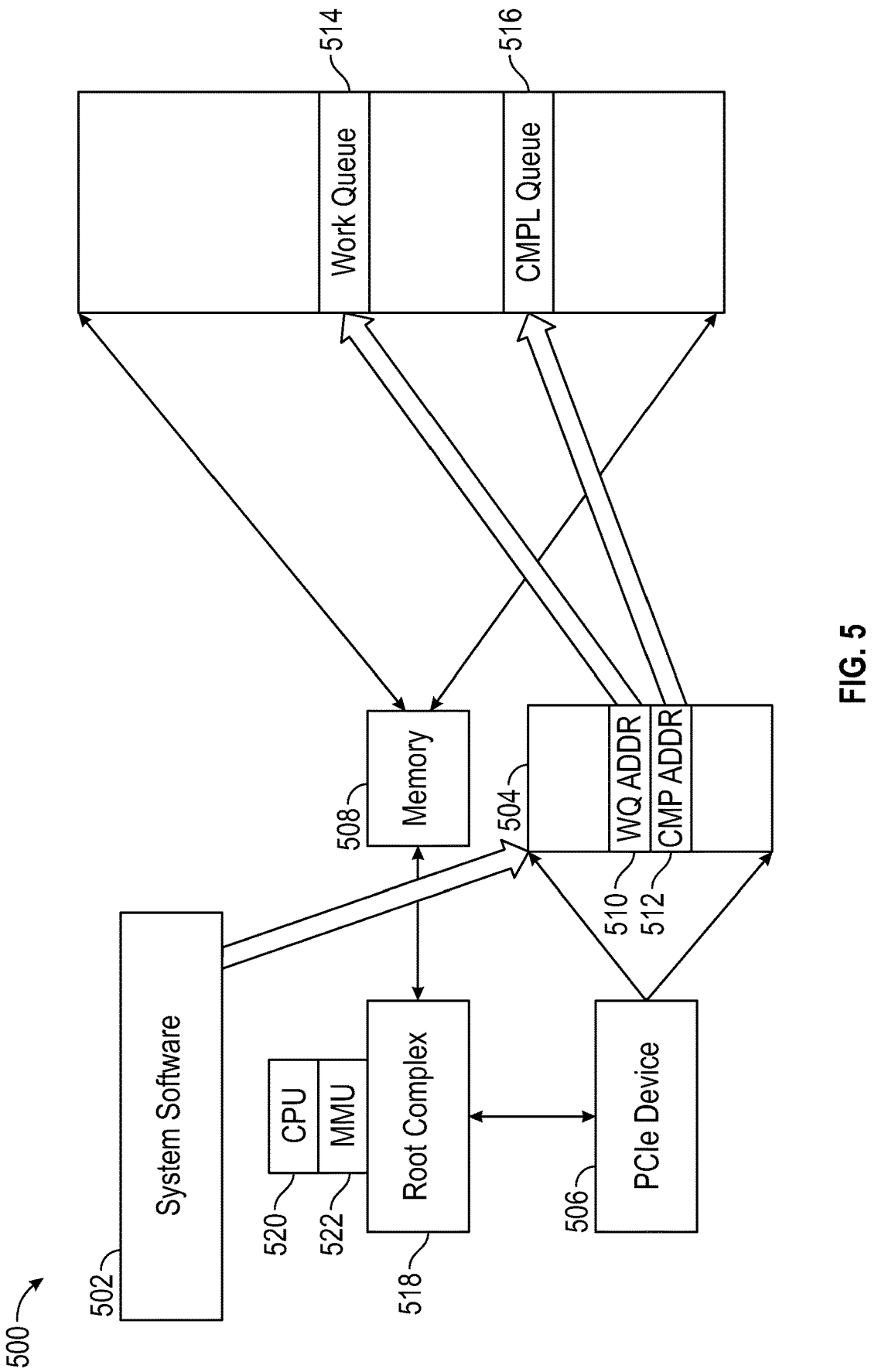
FIG. 5 illustrates a computing system concept in accordance with various embodiments.

FIG. 5 illustrates a computing system concept in accordance with various embodiments. Upon power up of computing system 500, the operating system (OS) software, device drivers, enumeration software, and the like, collectively "system software" 502 programs host connectivity registers 504 located in PCIe device 506. Host connectivity registers 504 contain pointers to locations in memory 508, for example, a work queue pointer 510 and a completion queue pointer 512 pointing to locations 514 and 516, respectively, in memory 508. Host connectivity registers 504 contain other information supporting host connectivity, not shown. Loss of data contained in host connectivity registers 504, for example, due to infield testing, would require software 502 to reprogram host connectivity registers 504, causing degradation of performance and user experience.

Root complex 518 connects central processing unit (CPU) 520, memory management unit (MMU) 522, and PCIe device 506 to memory 508. The root complex may be implemented in CPU 520 or a chipset or other circuitry. Computing system 500 may have multiple PCIe and other devices, not shown.

Figure 6:
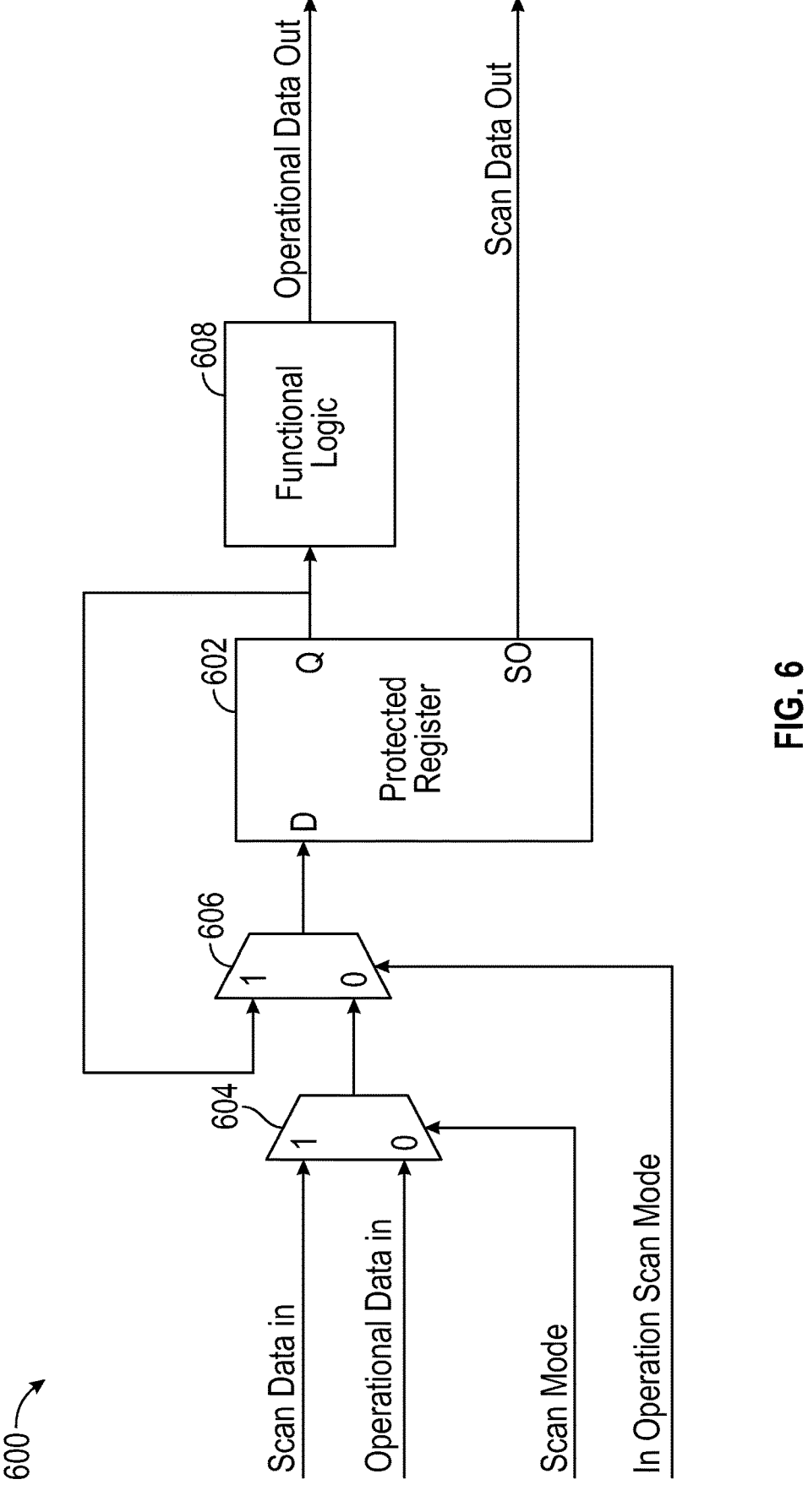
FIG. 6 illustrates an infield scan sealing technique in accordance with some embodiments.

FIG. 6 illustrates an infield scan sealing technique in accordance with some embodiments. In scan sealing circuitry 600, a bit of a protected register 602 maybe a traditional flip flop or other such storage device and store configuration or memory mapping data during operation of a computing system. When both a scan mode and an in operation scan mode are inactive, for example, during normal system operation, multiplexors 604 and 606 allow operational data to flow through protected register 602 and on to functional logic 608. When scan mode is active and in operation scan mode is inactive, for example, during a system power up or down testing event, multiplexors 604 and 606 allow scan data to pass through protected register 602. When scan mode is active and in operation scan mode is active, for example during infield testing when the computing system is operational, multiplexors 604 and 606 block scan data from passing through protected register 602 by selecting the output of protected register 602 as its input, thus maintaining values stored in protected register 602, effectively "sealing" protected register 602 and allowing remaining functional logic and other non-host connectivity registers to be tested.

Scan sealing circuitry 600 may be repeated for all bits of all host connectivity registers, allowing the device to retain its host connectivity while performing infield testing of the device while the computing system is operational. In this way, configuration and memory mapping data programmed at startup by OS software, enumeration software, and device drivers are maintained and the device may quickly return to full operation after scan testing is completed.

Figure 7:
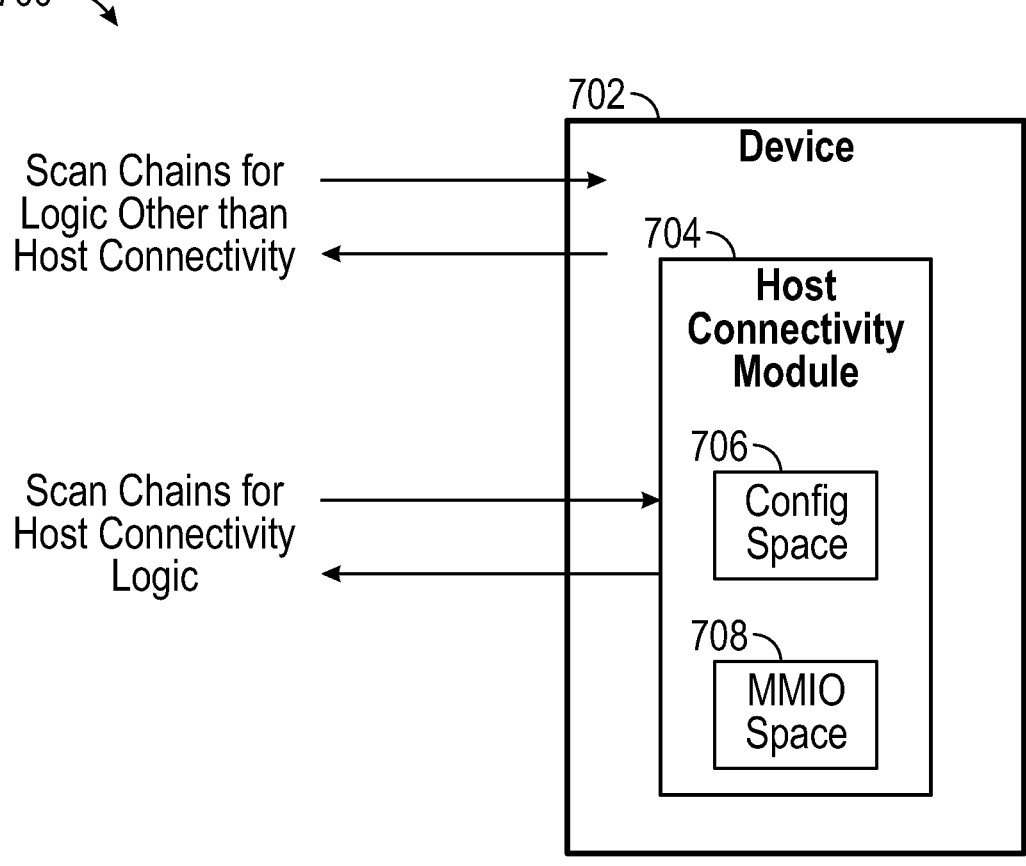
FIG. 7 illustrates a scan chain testing technique in accordance with some embodiments.

FIG. 7 illustrates a scan chain testing technique in accordance with some embodiments. In computing system 700, a device 702 includes a stand-alone host connectivity module 704 having configuration space registers 706 and memory mapping (MMIO) space registers 708. Scan chains used for testing may be divided into two sets, scan chains for logic other than host connectivity module 702 and scan chains for host connectivity module 702.

According to some embodiments, during power up or power down scan testing events, testing uses both scan chains, effectively testing the entire device for faults. Alternatively, during scan testing while computing system 700 is operational, only scan chains for logic other than host connectivity module 702 may be used.

According to some embodiments, the scan chains for host connectivity module 704 are dedicated scan chains and may be used to test any functional logic in host connectivity module 704. By having dedicated scan chains for host connectivity, the amount of logic on scan chains may be minimized and self-contained. During in operation scan testing events while system 700 is operational, host connectivity module 704 may be scan sealed, similar to the scan sealing technique of FIG. 6, preserving the contents of configuration space registers 706 and MMIO space registers 708. According to some embodiments, the entire host connectivity module 704 can be scan-sealed instead of identifying individual signals for scan-sealing.

Figure 8:
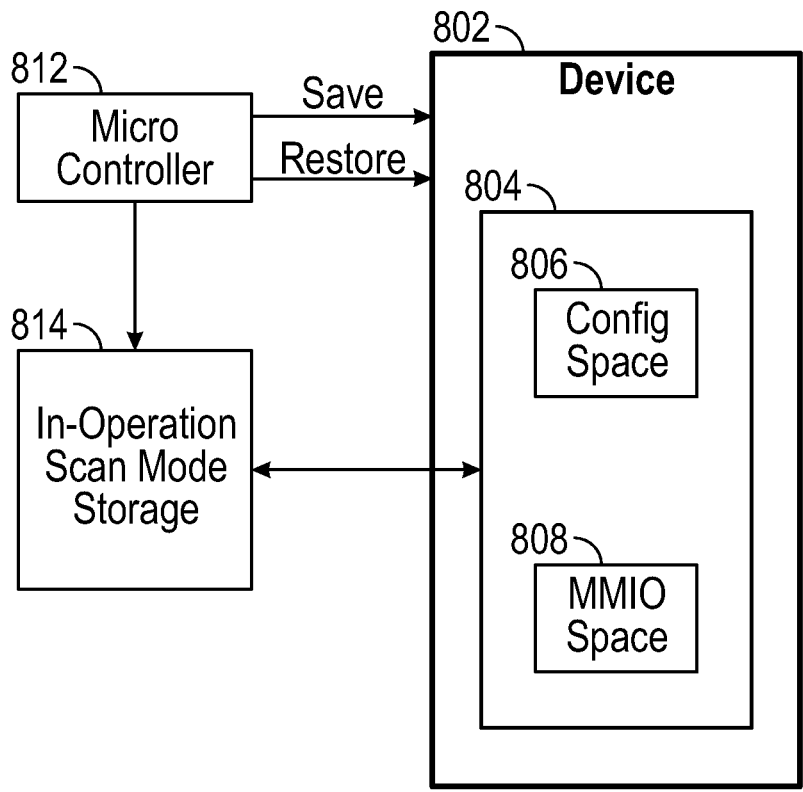
FIG. 8 illustrates an infield save and restore technique in accordance with some embodiments.

FIG. 8 illustrates an infield save and restore technique in accordance with some embodiments. In computing system 800, a device 802 includes host connectivity registers 804, including configuration space registers 806 and memory mapping (MMIO) space registers 808. A microcontroller 812 triggers save and restore signals, for example, at the beginning of infield testing (save) and at the end of infield testing (restore) while computing system 800 is operational. At the activation of the save signal, the contents of the host connectivity registers 804 are copied to an in-operation scan mode storage device 814. In-operation scan mode storage device 814 may be, for example, a static random access memory (SRAM), a double data rate memory (DDR), non-volatile memory or other memory type storage device. At the end of the infield testing, the restore signal become active, triggering the copying of the contents of in-operation scan mode storage device 814 back to host connectivity registers 804. Thus, the contents of host connectivity registers are maintained, allowing device 802 to continue operational functions without requiring reprogramming of host connectivity registers 804 by OS software, enumeration software, and/or device drivers.

According to some embodiments, in-operation scan mode storage device 814 may have its own power island. According to some embodiments, in-operation scan mode storage device 814 may be perpetual memory. Alternatively, according to some embodiments, in-operation scan mode storage device 814 may be connected to a separate power-island. According to some embodiments, in-operation scan mode storage device 814 may be powered by a testing power island, for example, a separate power island that is powered up in testing mode. Microcontroller 812 may control power to in-operation scan mode storage device 814.

Figure 9:
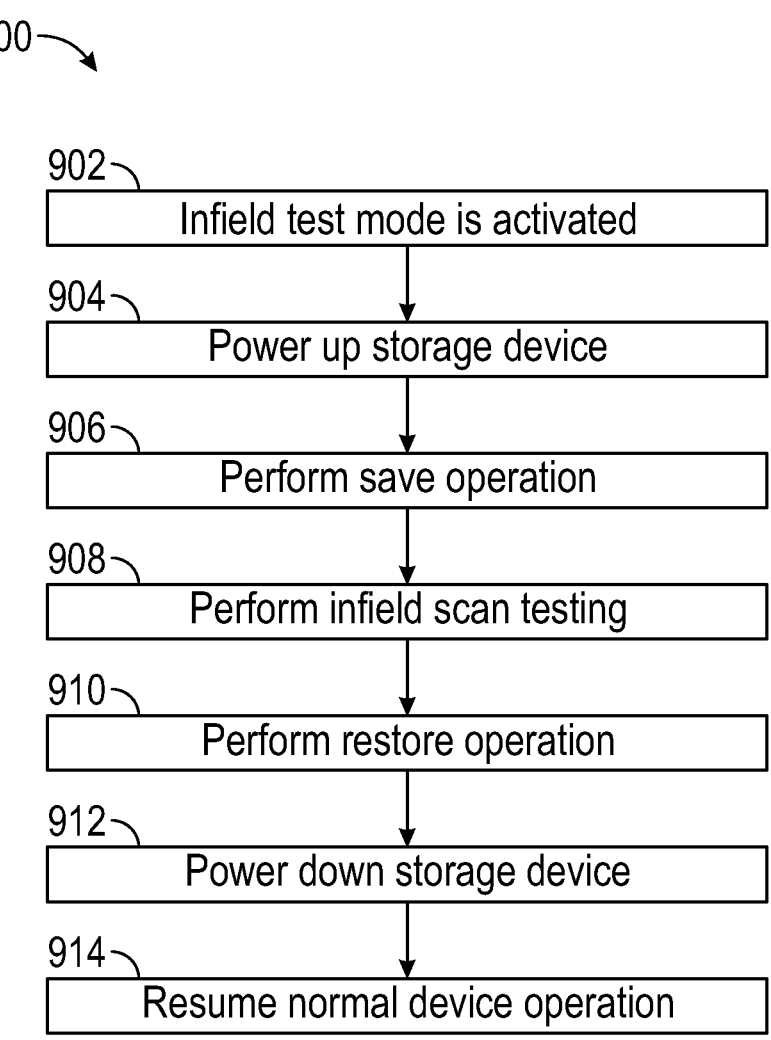
FIG. 9 illustrates an infield save and restore method in accordance with some embodiments.

FIG. 9 illustrates an infield save and restore method 900 in accordance with some embodiments. In-operation test mode is activated, block 902. The storage device is powered up, block 904. A save operation is performed, copying host connectivity registers to the storage device, block 906. In-operation scan testing is performed on the device, block 908. A restore operation is performed, copying the data in the storage device back to the host connectivity registers, block 910. The storage is then powered down, block 912. Normal device operation is resumed, block 914. Because the data contained in host connectivity registers is maintained, normal operation may be resumed quickly without a need for the data in these registers to be reprogrammed by software. In-operation testing may be performed periodically while the computing system is operational.

According to some embodiments, method 900 may omit blocks 904 and 912, the powering up and down of the storage device, for example, if the storage device is always powered on while the device is powered on.

Figure 10:
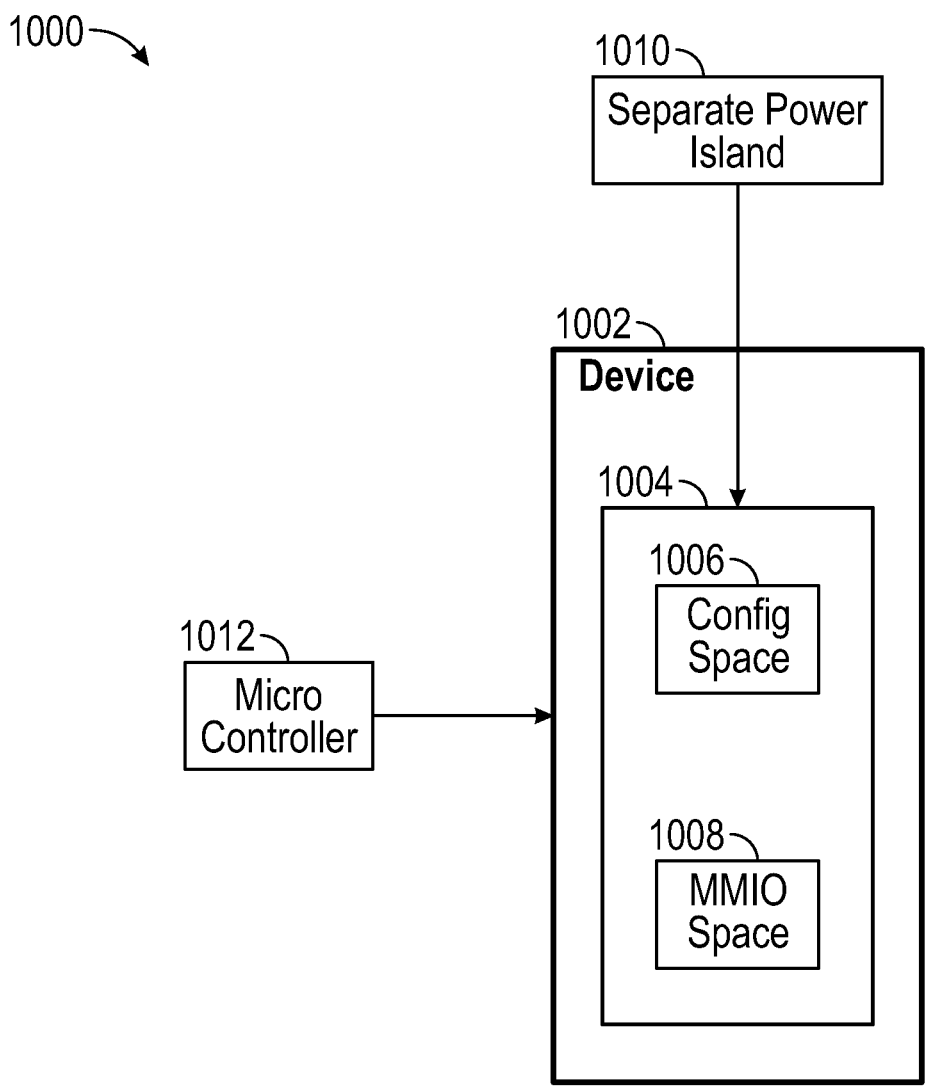
FIG. 10 illustrates an infield testing technique using a separate power island in accordance with some embodiments.

FIG. 10 illustrates an infield testing technique using a separate power island in accordance with some embodiments. In computing system 1000, a device 1002 includes host connectivity registers 1004, including configuration space registers 1006 and memory mapping (MMIO) space registers 1008. Host connectivity registers 1004 are located on a separate power island 1010, controlled by a microcontroller 1012. Microcontroller 1012 ensures that power remains on to separate power island 1010 such that host connectivity registers 1004 remain powered and separate during infield testing, preserving their contents.

According to some embodiments, host connectivity registers 1004 may be connected to an existing debug power island, for example, one that is powered up in debug mode. According to some embodiments, host connectivity registers 1004 may be located on a same silicon die as the circuitry on device 1002. Alternatively, according to some embodiments, host connectivity registers 1004 may be located on a separate silicon die and may be in the same package or in different packages.

Figure 11:
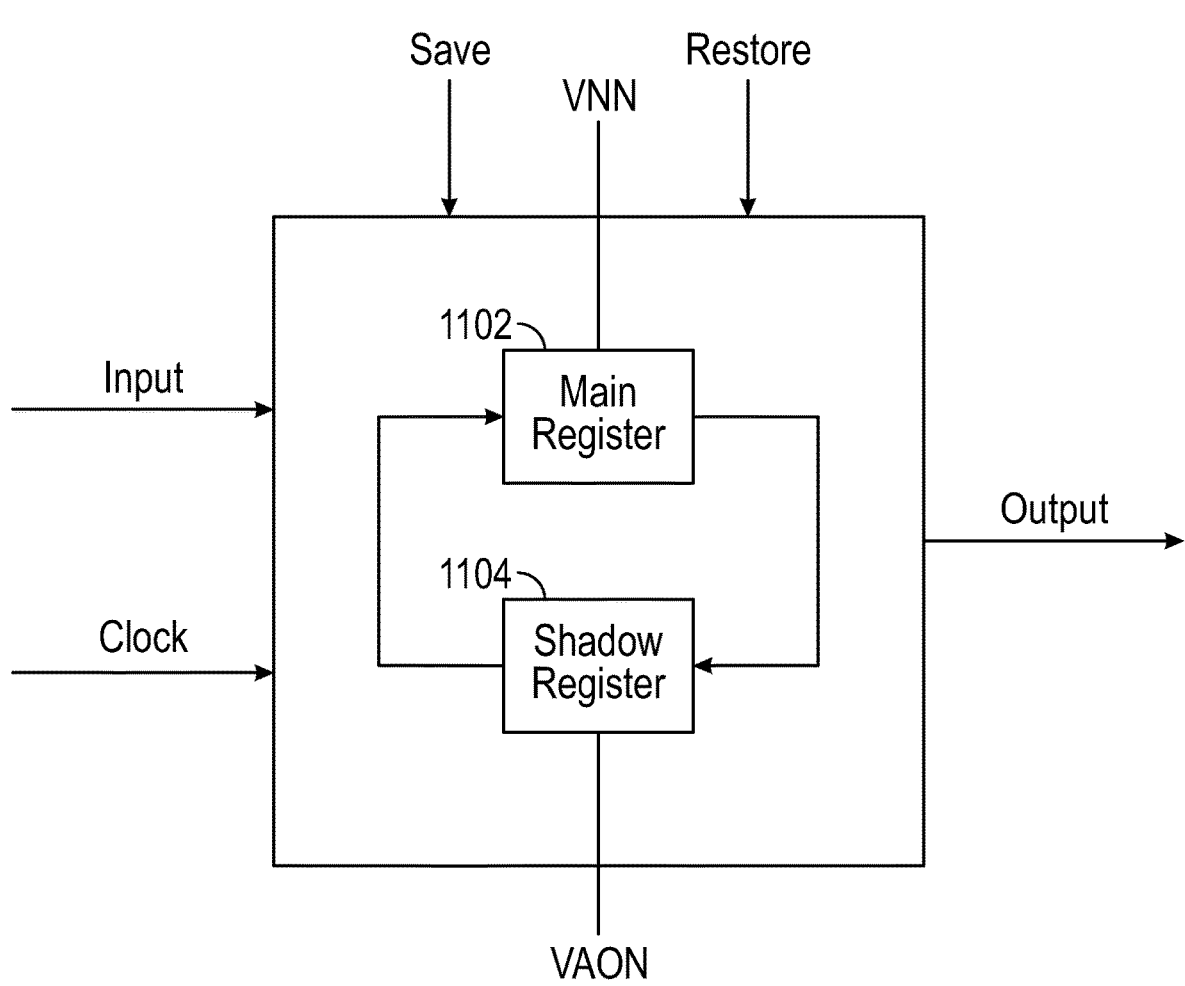
FIG. 11 illustrates an infield testing technique using retention cells in accordance with some embodiments.

FIG. 11 illustrates an infield testing technique using retention cells in accordance with some embodiments. A typical use of retention cell 1100 includes retaining data stored in main register 1102 during power-down by saving the data into a shadow register 1104, also referred to as a bubble register, before power-down. Upon power-up, data from shadow register 1104 is restored to main register 1102. The SAVE signal saves main register 1102 data into shadow register 1104 before power-down and the RESTORE signal restores the data from shadow register 1104 into main register 1102 after power-up. VAON is an always ON power supply to shadow register 1104, VNN is a power supply to main register 1102 that can be OFF during power gating conditions.

According to some embodiments, each bit of host connectivity registers may utilize a cell similar to retention cell 1100. When entering in-operation test mode, SAVE mode is triggered, saving main register 1102 data into shadow register 1104. Similarly, when exiting in-operation test mode, the RESTORE mode is triggered, restoring the data from shadow register 1104 into main register 1102. During in-operation testing mode VNN and VAON may both be ON. By utilizing retention cell 1100 for each bit of the host connectivity registers in this way, a device may seamlessly return to functional operation without any disruption to host connectivity registers after testing is complete.

Figure 12:
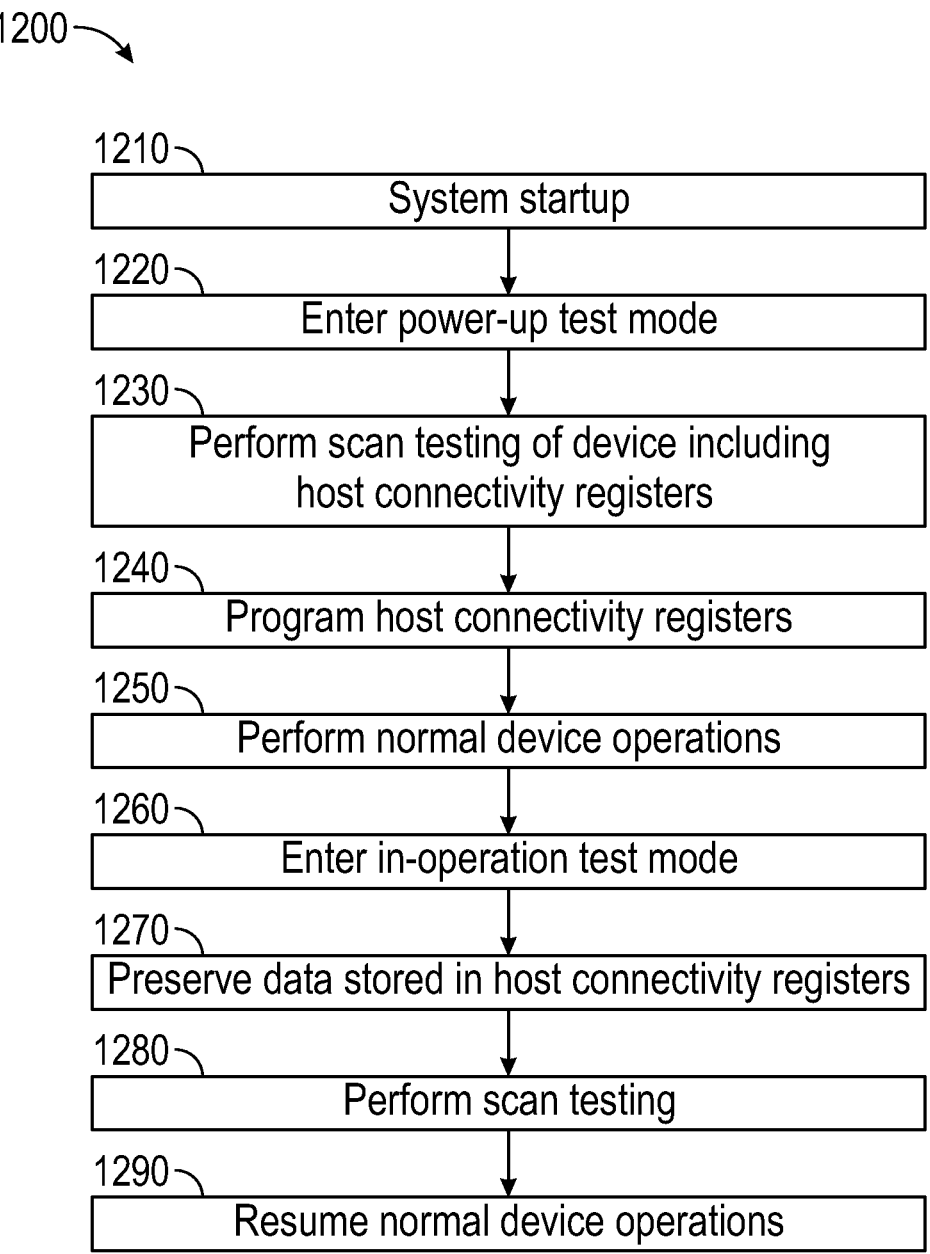
FIG. 12 illustrates a flow diagram of infield testing in accordance with various embodiments.

FIG. 12 illustrates a flow diagram 1200 of in-operation testing in accordance with various embodiments. A computes system with a device having host connectivity registers powers on, block 1210. A power up test mode on the device is entered, block 1220. Scan testing of the device is performed, block 1230. System software programs host connectivity registers, block 1240. The device performs normal device operations, block 1250. The device enters a scan test mode while the system remains in operation, block 1260. Data stored in host connectivity registers in the device is preserved, block 1270. Scan testing on the device is performed, block 1280. At the end of testing, the device resumes normal device operations, block 1290. The resumption of normal device activities can be resumed promptly without the need for the host connectivity registers to be reprogrammed.

While various embodiments described herein use the term System-on-a-Chip or System-on-Chip ("SoC") to describe a device or system having a processor and associated circuitry (e.g., Input/Output ("I/O") circuitry, power delivery circuitry, memory circuitry, etc.) integrated monolithically into a single Integrated Circuit ("IC") die, or chip, the present disclosure is not limited in that respect. For example, in various embodiments of the present disclosure, a device or system can have one or more processors (e.g., one or more processor cores) and associated circuitry (e.g., Input/Output ("I/O") circuitry, power delivery circuitry, etc.) arranged in a disaggregated collection of discrete dies, tiles and/or chiplets (e.g., one or more discrete processor core die arranged adjacent to one or more other die such as memory die, I/O die, etc.). In such disaggregated devices and systems the various dies, tiles and/or chiplets can be physically and electrically coupled together by a package structure including, for example, various packaging substrates, interposers, active interposers, photonic interposers, interconnect bridges and the like. The disaggregated collection of discrete dies, tiles, and/or chiplets can also be part of a System-on-Package ("SoP").

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

Examples

The following examples pertain to further embodiments. An example may be an apparatus, comprising computing circuitry; host connectivity registers; scan test circuitry to perform infield testing of the computing circuitry and host connectivity registers; and preservation circuitry to preserve data stored in the host connectivity registers during in-operation infield testing.

Another example may include wherein the preservation circuitry comprises scan seal circuitry, wherein the scan seal circuitry to enable scan data to bypass the host connectivity registers.

Another example may include wherein the scan data comprises a first set of scan data for the computing circuitry and a second set of scan data for the host connectivity registers.

Another example may include wherein the preservation circuitry to copy the data stored in the host connectivity registers to an in-operation test mode storage device at the beginning of an in-operation test event and restore the data in the host connectivity registers at the end of the in-operation test event.

Another example may include wherein the preservation circuitry comprises a separate power island for the host connectivity registers.

Another example may include wherein the preservation circuitry comprises retention cell circuitry; the retention cell circuitry to copy the data stored in the host connectivity registers to shadow registers at the beginning of an in-operation test event and restore the data in the host connectivity registers at the end of the in-operation test event.

Another example may include wherein the preservation circuitry is not activated during power on test events.

Another example may include a system comprising: memory; a device comprising: computing circuitry comprising a compute engine, logic to access the memory, and input/output (I/O) logic; host connectivity registers, wherein the host connectivity registers include a pointer to a work queue in the memory; scan test circuitry to perform infield testing of the computing circuitry and host connectivity registers; and preservation circuitry to preserve data stored in the host connectivity registers during in-operation infield testing.

Another example may include a method comprising: performing normal device operations on a device, the device including host connectivity registers; entering a scan testing mode, the scan testing mode comprising: preserving values stored in the host connectivity registers; performing scan testing on the device; and resuming the performing of the normal device operations.

Another example may include wherein the preserving values stored in the host connectivity registers comprises scan sealing the host connectivity registers, enabling scan data to bypass the host connectivity registers.

Another example may include wherein the scan data comprises a first set of scan data for computing circuitry of the device and a second set of scan data for the host connectivity registers.

Another example may include wherein the preserving values stored in the host connectivity registers comprises copying the data stored in the host connectivity registers to an in-operation test mode storage device at the beginning of an in-operation test event and restoring the data in the host connectivity registers at the end of the in-operation test event.

Another example may include wherein the preserving values stored in the host connectivity registers comprises copying the data stored in the host connectivity registers to shadow registers of a retention cell at the beginning of an in-operation test event and restoring the data in the host connectivity registers at the end of the in-operation test event.

Another example may include further comprising performing scan testing on the device at a power on event without preserving values stored in the host connectivity registers.

Another example may include an apparatus comprising means to perform one or more elements of a method described in or related to any of examples herein, or any other method or process described herein.

Another example may include one or more non-transitory computer-readable media comprising instructions to cause an electronic device, upon execution of the instructions by one or more processors of the electronic device, to perform one or more elements of a method described in or related to any of examples herein, or any other method or process described herein.

Another example may include an apparatus comprising logic, modules, or circuitry to perform one or more elements of a method described in or related to any of examples herein, or any other method or process described herein.

Another example may include a method, technique, or process as described in or related to any of examples herein, or portions or parts thereof.

Another example may include an apparatus comprising: one or more processors and one or more computer readable media comprising instructions that, when executed by the one or more processors, cause the one or more processors to perform the method, techniques, or process as described in or related to any of examples herein, or portions thereof.

Another example may include a signal as described in or related to any of examples herein, or portions or parts thereof.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EE- PROMs), magnetic or optical cards, or any other type of media suitable for storing electronic instructions.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
computing circuitry;
host connectivity registers, wherein the host connectivity registers are to store configuration and/or memory mapping data programmed upon power-up;
scan test circuitry to perform infield testing of the computing circuitry and host connectivity registers; and
preservation circuitry to preserve data stored in the host connectivity registers during in- operation infield testing.

2. The apparatus of claim 1, wherein the preservation circuitry comprises scan seal circuitry, wherein the scan seal circuitry to enable scan data to bypass the host connectivity registers.

3. The apparatus of claim 2, wherein the scan data comprises a first set of scan data for the computing circuitry and a second set of scan data for the host connectivity registers.

4. The apparatus of claim 1, wherein the preservation circuitry to copy the data stored in the host connectivity registers to an in-operation test mode storage device at a beginning of an in-operation test event and restore the data in the host connectivity registers at an end of the in-operation test event.

5. The apparatus of claim 1, wherein the preservation circuitry comprises a separate power island for the host connectivity registers.

6. The apparatus of claim 1, wherein the preservation circuitry comprises retention cell circuitry; the retention cell circuitry to copy the data stored in the host connectivity registers to shadow registers at a beginning of an in-operation test event and restore the data in the host connectivity registers at an end of the in-operation test event.

7. The apparatus of claim 1, wherein the preservation circuitry is not activated during power on test events.

8. The apparatus of claim 1, wherein the host connectivity registers include one or more of a base address region register, a power state register to describe supported power states, an interrupt register to describe types of interrupts supported, and/or a memory mapped input output register.

9. A system comprising:
memory;
a device comprising:
    computing circuitry comprising a compute engine, logic to access the memory, and input/output (I/O) logic;
    host connectivity registers, wherein the host connectivity registers include a pointer to a work queue in the memory;
    scan test circuitry to perform infield testing of the computing circuitry and host connectivity registers; and preservation circuitry to preserve data stored in the host connectivity registers during in-operation infield testing.

10. The system of claim 9, wherein the preservation circuitry comprises scan seal circuitry, wherein the scan seal circuitry to enable scan data to bypass the host connectivity registers.

11. The system of claim 10, wherein the scan data comprises a first set of scan data for the computing circuitry and a second set of scan data for the host connectivity registers.

12. The system of claim 9, wherein the preservation circuitry to copy the data stored in the host connectivity registers to an in-operation test mode storage device at a beginning of an in-operation test event and restore the data in the host connectivity registers at an end of the in-operation test event.

13. The system of claim 9, wherein the preservation circuitry comprises a separate power island for the host connectivity registers.

14. The system of claim 9, wherein the preservation circuitry comprises retention cell circuitry; the retention cell circuitry to copy the data stored in the host connectivity registers to shadow registers at a beginning of an in-operation test event and restore the data in the host connectivity registers at an end of the in-operation test event.

15. The system of claim 9, wherein the preservation circuitry is not activated during power on/off test events.

16. A method comprising:
performing normal device operations on a device, the device including host connectivity registers, wherein the host connectivity registers are to store configuration and/or memory mapping data programmed upon power-up;
entering a scan testing mode, the scan testing mode comprising:
    preserving values stored in the host connectivity registers;
    performing scan testing on the device; and
resuming the performing of the normal device operations.

17. The method of claim 16, wherein the preserving values stored in the host connectivity registers comprises scan sealing the host connectivity registers, enabling scan data to bypass the host connectivity registers.

18. The method of claim 17, wherein the scan data comprises a first set of scan data for computing circuitry of the device and a second set of scan data for the host connectivity registers.

19. The method of claim 16, wherein the preserving values stored in the host connectivity registers comprises copying the data stored in the host connectivity registers to an in-operation test mode storage device at a beginning of an in-operation test event and restoring the data in the host connectivity registers at an end of the in-operation test event.

20. The method of claim 16, wherein the preserving values stored in the host connectivity registers comprises copying the data stored in the host connectivity registers to shadow registers of a retention cell at a beginning of an in-operation test event and restoring the data in the host connectivity registers at an end of the in-operation test event.

* * * * *